(12) United States Patent
Tanaka (10) Patent No.: US 7,402,867 B2
(45) Date of Patent: Jul. 22, 2008

(54) SEMICONDUCTOR DEVICE (75) Inventor: Kouji Tanaka, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 86 days.

(21) Appl. No.: 10/952,752

(22) Filed: Sep. 30, 2004

(65) Prior Publication Data
US 2005/0067657 A1    Mar. 31, 2005

(30) Foreign Application Priority Data
Sep. 30, 2003    (JP) .............................. 2003-340849

(51) Int. Cl.
*H01L 29/72* (2006.01)
(52) U.S. Cl. .................. 257/355; 257/173; 257/618; 257/622
(58) Field of Classification Search ................ 257/355, 257/173, 618, 622
See application file for complete search history.

(56) References Cited

U.S. PATENT DOCUMENTS 4,309,714 A  *  1/1982  Slatter ........................ 257/134
4,690,714 A  *  9/1987  Li ................................ 438/24
6,794,689 B1 *  9/2004  Feiler .......................... 257/107

FOREIGN PATENT DOCUMENTS

| CN | 1279822 | * | 1/2001 |
|---|---|---|---|
| JP | 1-214055 | | 8/1989 |

* cited by examiner

Primary Examiner—Edward Wojciechowicz
(74) Attorney, Agent, or Firm—Young & Thompson

(57) ABSTRACT

In a semiconductor device, a plurality of first diffusion regions of a first conductive type are formed on a diffusion layer well of the first conductive type. A plurality of second diffusion regions of a second conductive type are formed on the diffusion layer well of the first conductive type. An impurity concentration of each of the plurality of first and second diffusion regions is desirably higher than that of the diffusion layer well. The plurality of first diffusion regions are connected to a first common node as an anode and the plurality of second diffusion regions are connected to a second common node as a cathode.

17 Claims, 8 Drawing Sheets

Fig. 8

SEMICONDUCTOR DEVICE

BACKGROUND OF THE INVENTION

1. Field of the Invention

The present invention relates to a semiconductor device, more particularly to a protection element to protect an internal circuit of a semiconductor device.

2. Description of the Related Art

Figure 1A:
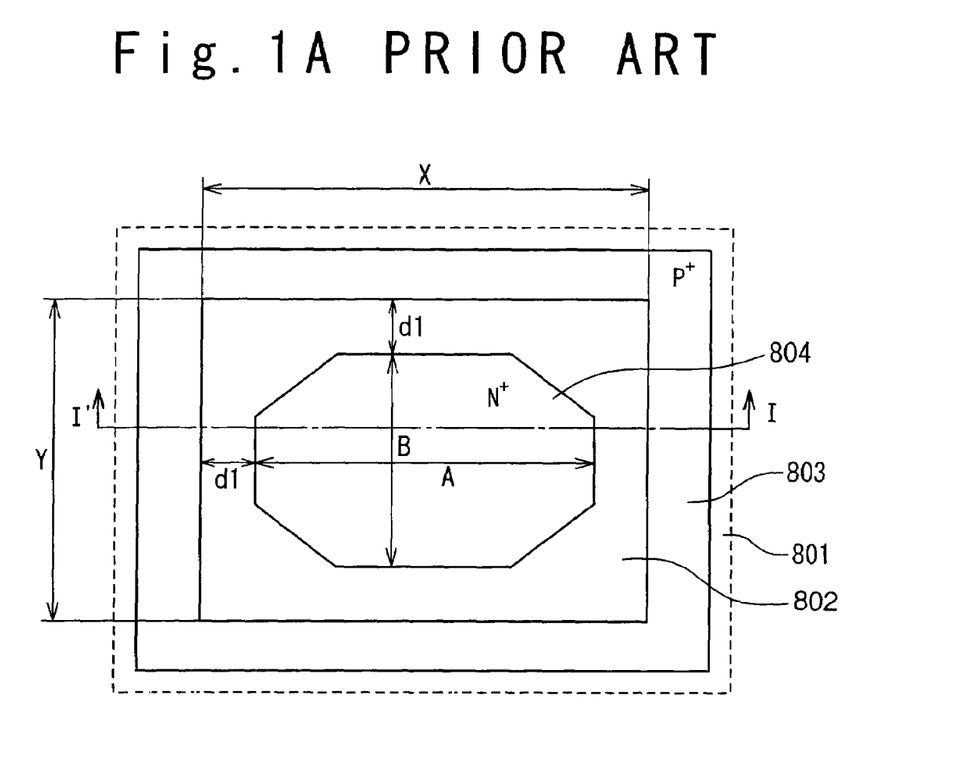
FIG. 1A is a plan view of a conventional diode.
Figure 1B:
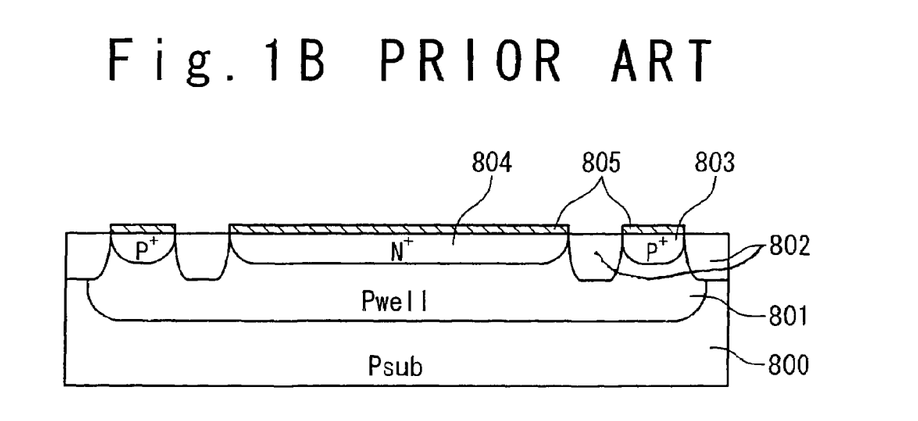
FIG. 1B is a cross sectional view of the conventional diode along I-I' line of FIG. 1A.

In recent years, in order to protect the internal circuit of an IC from current of electrostatic surge, a protection element is provided for the input terminal. As this protection element, a diode with a high breakdown voltage is generally used. FIGS. 1A and 1B show such a conventional high breakdown voltage diode. Referring to FIGS. 1A and 1B, in the conventional diode, a P-type well 801 is formed in a P-type semiconductor substrate 800, and a $P^+$-type diffusion layer 803 is formed in a ring along an outer circumference of the P-type well 801 to have a higher impurity concentration than the P-type well 801. An $N^+$-type diffusion layer 804 is formed in a region of the P-type well 801 surrounded by the $P^+$-type diffusion layer 803. It should be noted that the $P^+$-type diffusion layer 803 and the $N^+$-type diffusion layer 804 separated by an element separation region (insulation region) 802, and contacts 805 are formed on the respective diffusion layers to form an anode and a cathode. In this way, in the conventional high breakdown voltage diode, the breakdown voltage is improved by forming the large $N^+$-type diffusion layer 804. For example, such a conventional example is disclosed in Japanese Laid Open Patent Application (JP-A-Heisei 1-214055)

However, in the structure of the above-mentioned conventional high breakdown voltage diode, in order to need a large region for improvement of the breakdown voltage, the high integration becomes difficult.

SUMMARY OF THE INVENTION

An object of the present invention is to provide a high breakdown voltage diode suitable for integration.

In an aspect of the present invention, a semiconductor device includes a plurality of first diffusion regions of a first conductive type formed on a diffusion layer well of the first conductive type; and a plurality of second diffusion regions of a second conductive type formed on the diffusion layer well of the first conductive type. An impurity concentration of each of the plurality of first and second diffusion regions is desirably higher than that of the diffusion layer well. The plurality of first diffusion regions are connected to a first common node as an anode and the plurality of second diffusion regions are connected to a second common node as a cathode.

DESCRIPTION OF THE PREFERRED EMBODIMENTS

Hereinafter, a semiconductor device of the present invention will be described in detail with reference to the attached drawings.

In the semiconductor device of the present invention, a plurality of $N^+$-type diffusion regions and a plurality of $P^+$-type diffusion region are provided in a P-type well. Thus, the breakdown voltage of a diode is improved which is formed by the plurality of $N^+$-type diffusion regions (the cathode) and the plurality of $P^+$-type diffusion regions (the anode).

Figure 2A:
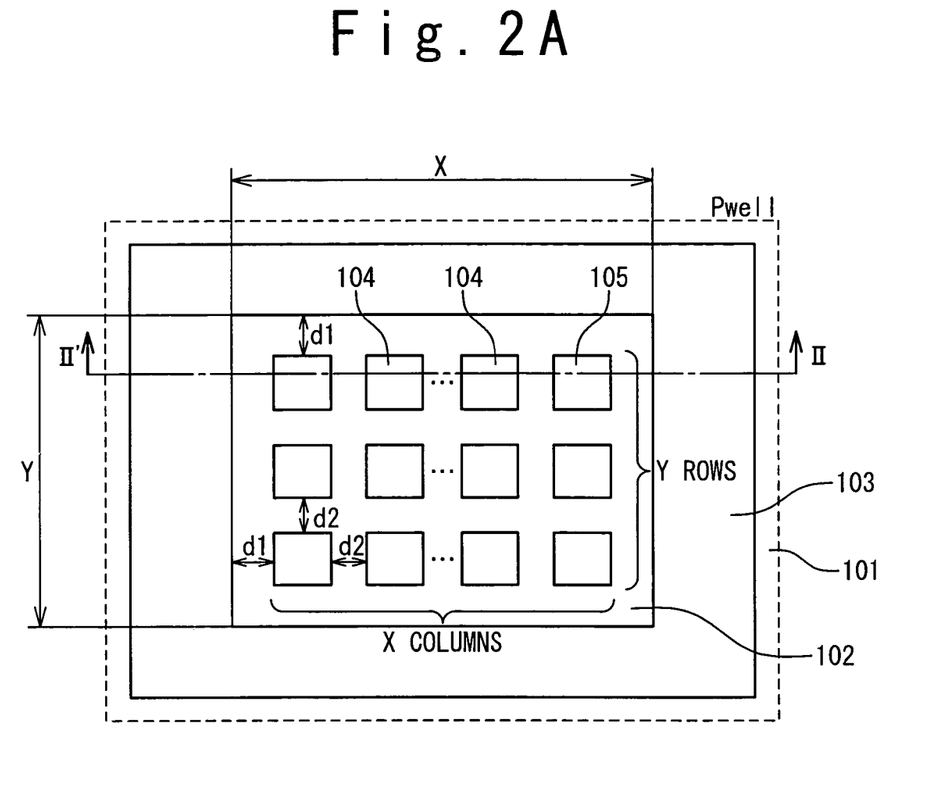
FIG. 2A is a plan view of a diode according to a first embodiment of the present invention.
Figure 2B:
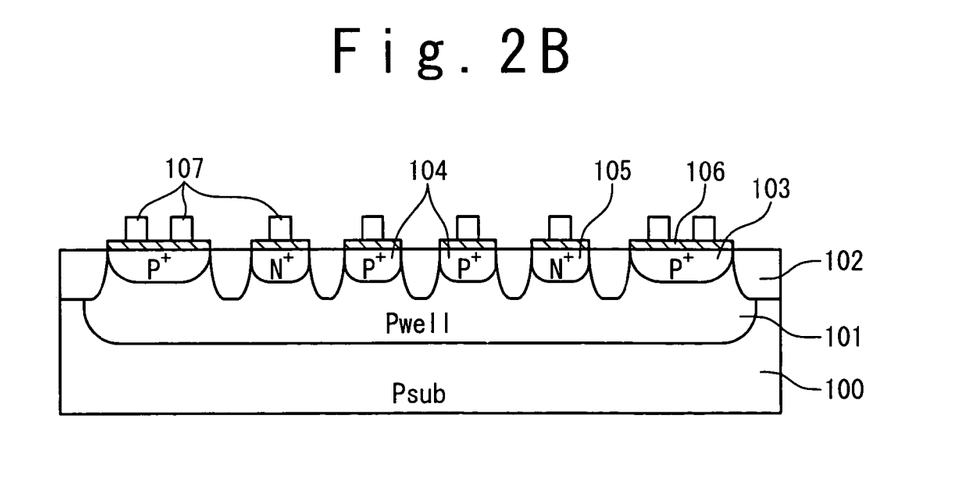
FIG. 2B is a cross sectional view of the diode according to the first embodiment of the present invention along II-II' line of FIG. 2A.

As shown in FIG. 2A, in the first embodiment of the present invention, a P-type well 101 is formed in a P-type semiconductor substrate 100 as a P-type embedded diffusion layer to have a higher impurity concentration than that of the P-type semiconductor substrate 100. A $P^+$-type diffusion layer 103 is formed in the P-type well 101 in a ring along an outer circumference of the P-type well 101. A plurality of $N^+$-type rectangular diffusion regions 105 and a plurality of $P^+$-type rectangular diffusion regions 104 are provided in a region of the P-type well 101 surrounded by the $P^+$-type diffusion layer 103. The $P^+$-type diffusion region 104 has a higher impurity concentration higher than that of the P-type well 101. A device separation region (insulation region) 102 is formed in the outer circumference of the P-type well 101 to contact the P-type semiconductor substrate 100 and the P-type well 101. Other device separation regions are formed between the diffusion regions to insulate them from each other but do not reach the bottom of the P-type well 101. It is supposed that a distance between the $P^+$-type diffusion layer 103 and an end portion of one of the plurality of $P^+$-type or $N^+$-type diffusion regions 104 and 105 is d1 and a distance between every two of the plurality of $P^+$-type or $N^+$-type diffusion regions 104 and 105 is d2. The distance d1 is larger than the distance d2, and d1 is 4 μm and d2 is 0.5 μm, for example. Also, although being not shown, the plurality of $N^+$-type diffusion regions 105 are connected with each other to function as a cathode of the diode and the plurality of $P^+$-type diffusion regions 104 are connected with each other to function as an anode of the diode.

Figure 3:
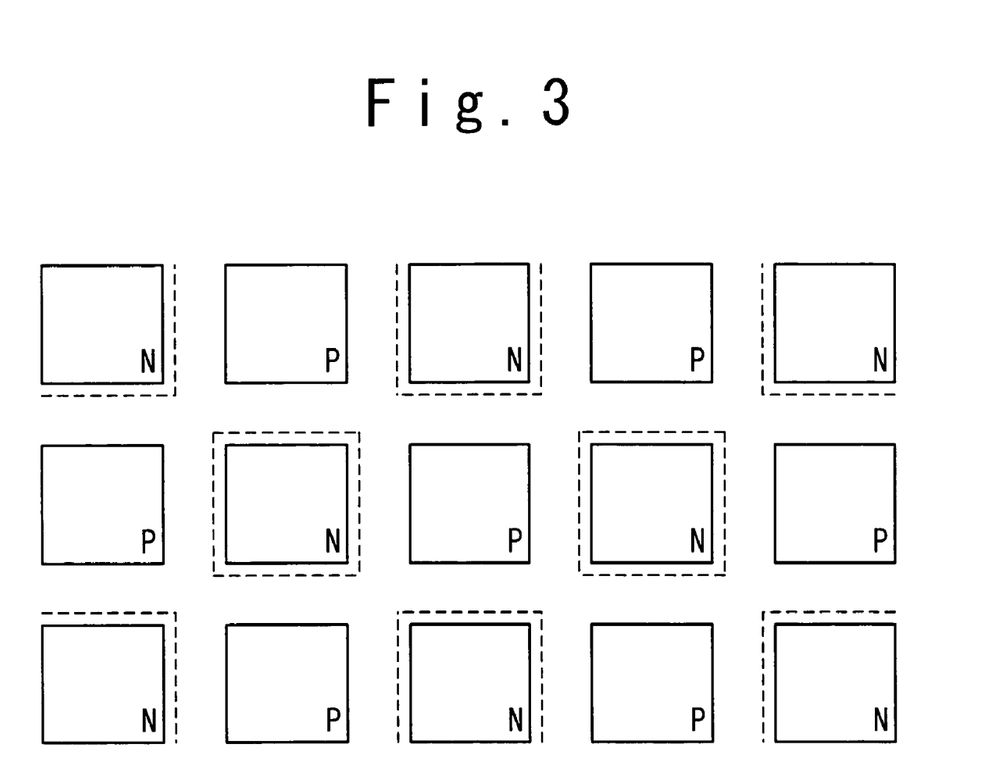
FIG. 3 is a plan view showing a circumference length in the diode in the first embodiment.

As shown in FIG. 3, the plurality of $N^+$-type diffusion regions 105 and the plurality of $P^+$-type diffusion regions 104 are arranged in a matrix in such a manner that the $N^+$-type diffusion region 105 and the $P^+$-type diffusion region 104 are alternately arranged in the column direction and the row direction. Thus, the $N^+$-type diffusion region 105 is surrounded by the $P^+$-type diffusion regions 104 and the $P^+$-type diffusion region 105 is surrounded by the $N^+$-type diffusion regions 105. Therefore, a circumference length, i.e., a total length of sides of the N$^+$-type diffusion region opposing to the other P$^+$-type diffusion regions can be made long. The opposing sides are shown in FIG. 3 by a dot line. Here, in FIG. 3, the diffusion regions are arranged in the three rows and five columns as an example. When one side of the diffusion region is 1 μm, 22 sides of the N$^+$-type diffusion regions are opposite to those of the P$^+$-type diffusion regions. Thus, the circumference length of the opposing sides is 22 μm.

Next, ESD breakdown, area and circumference length of the diffusion regions will be described below.

In the conventional diode structure shown in FIG. 1A, the area and circumference length of the diffusion region 804 were determined in three examples, in which the length A in a horizontal direction was changed to 1/2a, a and 2a μm in case of the length B of a μm in a vertical direction, and the EDS breakdown was simulated for each of the different horizontal lengths A. In this case, the calculation is carried out as X=A+d1*2 and Y=B+d1*2, and d1=4 μm. Thus, the result shown in FIG. 3A was obtained for the conventional diode structure of FIG. 1A. At this time, the ESD breakdown as the result of the simulation can be expressed by the straight line of (4/5)* (area shown by X*Y)+500.

Figure 4A:
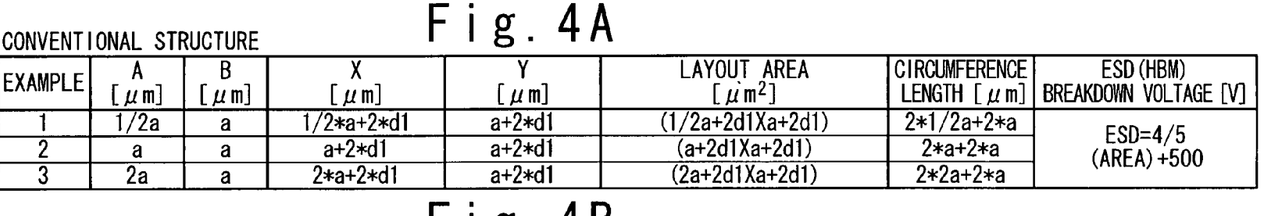
FIG. 4A is a table showing values of an area, a circumference length, and an ESD breakdown voltage in a conventional diode structure.
Figure 4B:
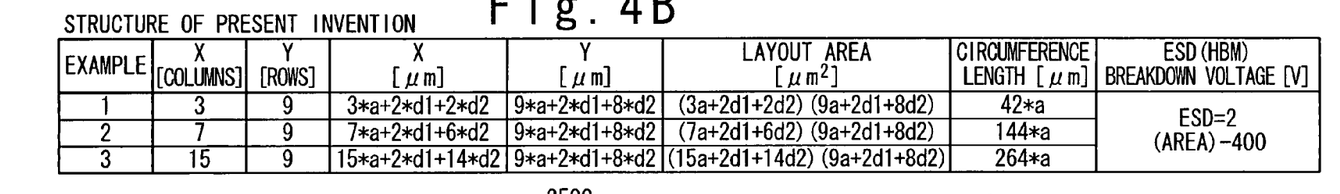
FIG. 4B is a table showing values of an area, a circumference length, and an ESD breakdown voltage in the diode structure according to the first embodiment of the present invention.

On the other hand, in the diode structure of the first embodiment of the present invention, the area and circumference length of the diffusion regions 105 or 104 were determined in three examples, in which the diffusion regions were arranged in the rows X of 3, 7 or 15 and the columns Y of 9 and each diffusion region is a square of a μm* a μm. The EDS breakdown was simulated for each example. In this case, the calculation is carried out as X=(the number of rows)*a+d1*2+d2*(the number of rows −1) and Y=(the number of columns)*a+d1*2+d2*(the number of columns −1). Thus, the result shown in FIG. 4B was obtained for the diode structure of the present invention. At this time, the ESD breakdown as the result of the simulation can be expressed by the straight line of 2*(area shown by X*Y)−400.

Figure 4C:
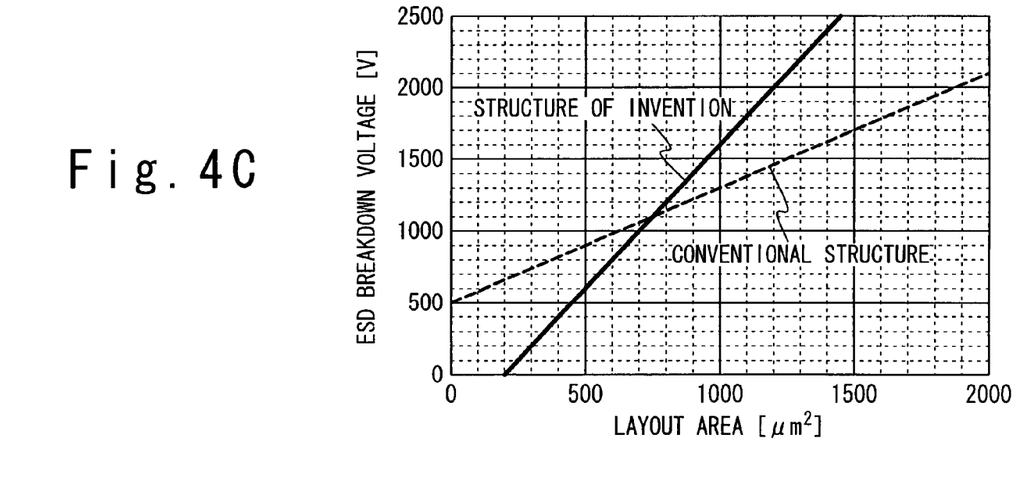
FIG. 4C is a graph of ESD breakdown voltage and layout area between the conventional diode structure and the diode structure in the first embodiment.

These results are plotted as shown in FIG. 4C, in which the horizontal axis is a layout area and the vertical axis is ESD endurance. From this result, it could be understood that the diode as the protection device can be formed in a smaller area when the EDS breakdown voltage of 1000 V or more is required in the Military (MIL) Standard. Also, if an area required in case of the conventional example and an area required in case of the present invention required are compared in the same EDS breakdown voltage of about 2000 V because the 2000 V is necessary as the breakdown voltage to electrostatic discharge, the area of about 1150 μm$^2$ is required in case of the present invention while the area of about 2000 μm$^2$ is required in case of the conventional example.

It should be noted that the EDS breakdown voltage decreases in this embodiment in the diode structure of 3 rows and 9 columns. This is because the distance d2 between the diffusion regions is as short as 0.5 μm. However, the ESD breakdown voltage increases even if the distance d2 is 0.5 μm when the 15 rows and 9 columns are adopted. Therefore, if the number of the diffusion regions is increased, a current flowing through each of the diffusion regions can be suppressed so that the EDS breakdown voltage could be improved. Also, the distance d1 is set to 4 μm to adopt the same condition as the conventional example. In this case, if the distance d1 is set to 0.5 μm which is same as the distance between the diffusion regions, the number of diffusion regions can be increased or changed without changing the area. Through the increase of the diffusion regions, the circumference length can be increased and the EDS breakdown voltage can be improved. Therefore, it is possible to improve the EDS breakdown voltage in a small area, compared with the conventional example.

Figure 5:
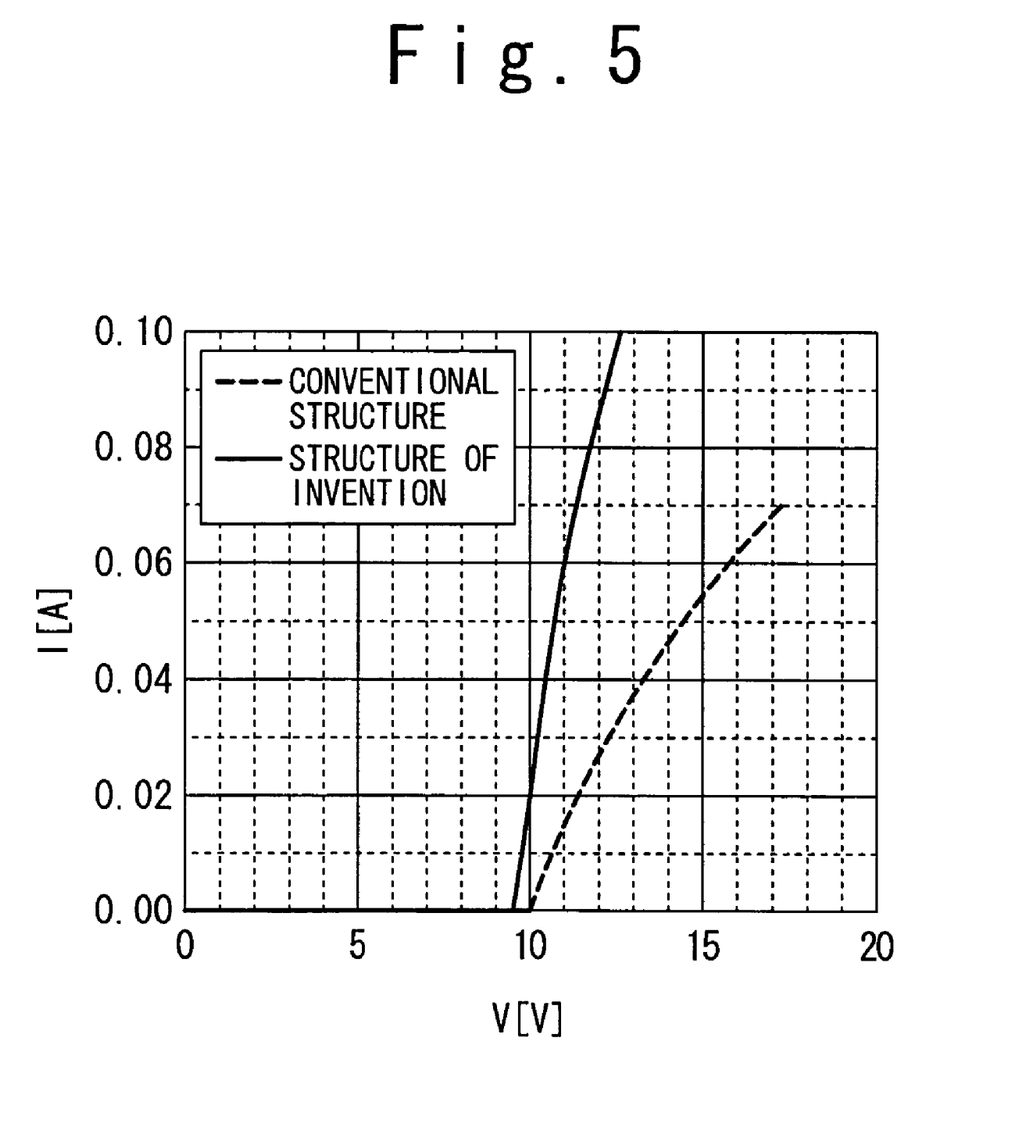
FIG. 5 is a graph showing a relationship of breakdown voltage and current between the conventional diode structure and the diode structure in the first embodiment.

FIG. 5 shows the simulation result of the relation of voltage and current in the conventional diode structure and the diode structure of the embodiment. Here, the horizontal axis is voltage V (V) and the vertical axis is current I (A). The conventional example in which the circumference length is Z μm and the present invention in which the circumference length is 4*Z μm are compared under the condition that the area is same. As seen from FIG. 5, an operation resistance when the diode is broken down is small in the present invention, compared with the conventional example. Therefore, the breakdown current of the diode increases and ESD breakdown voltage becomes large.

Figure 6:
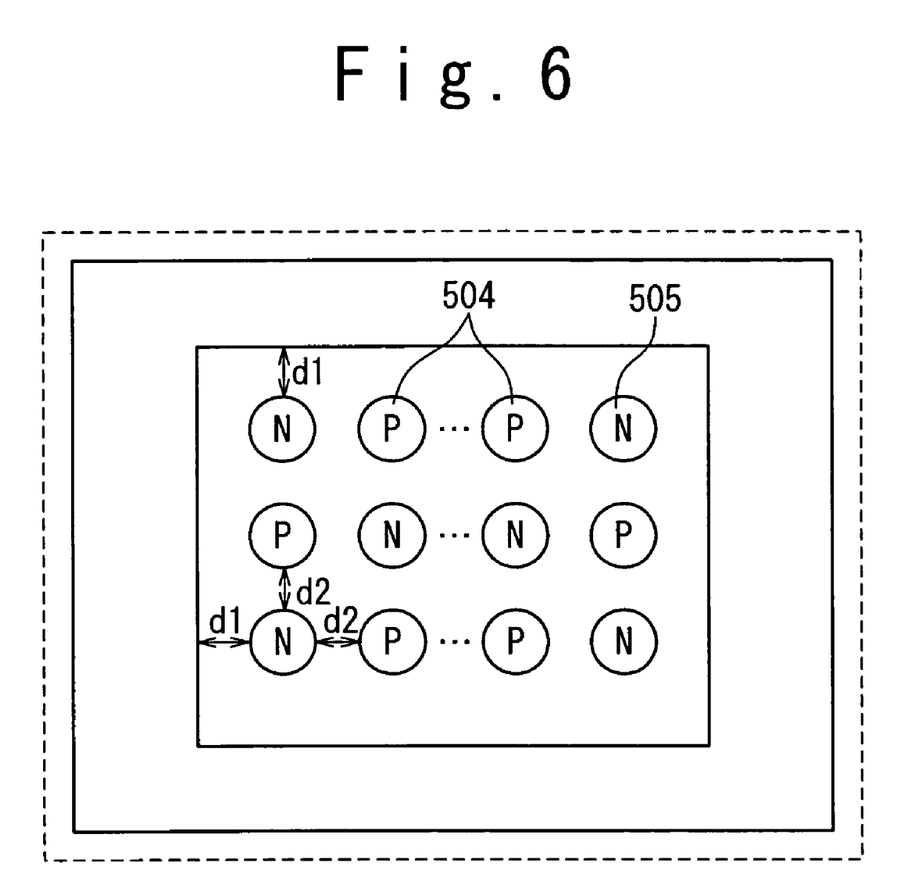
FIG. 6 is a plan view of the diode according to a second embodiment of the present invention.

In the above first embodiment, the rectangular diffusion regions are arranged. However, in the diode according to the second embodiment of the present invention, the shape of each of P$^+$-type diffusion region 504 and N$^+$-type diffusion region 505 is circular, as shown in FIG. 6. The definitions of the distances d1 and d2 are same as in the above embodiment. This embodiment is effective when the size of each diffusion region is small.

Figure 7:
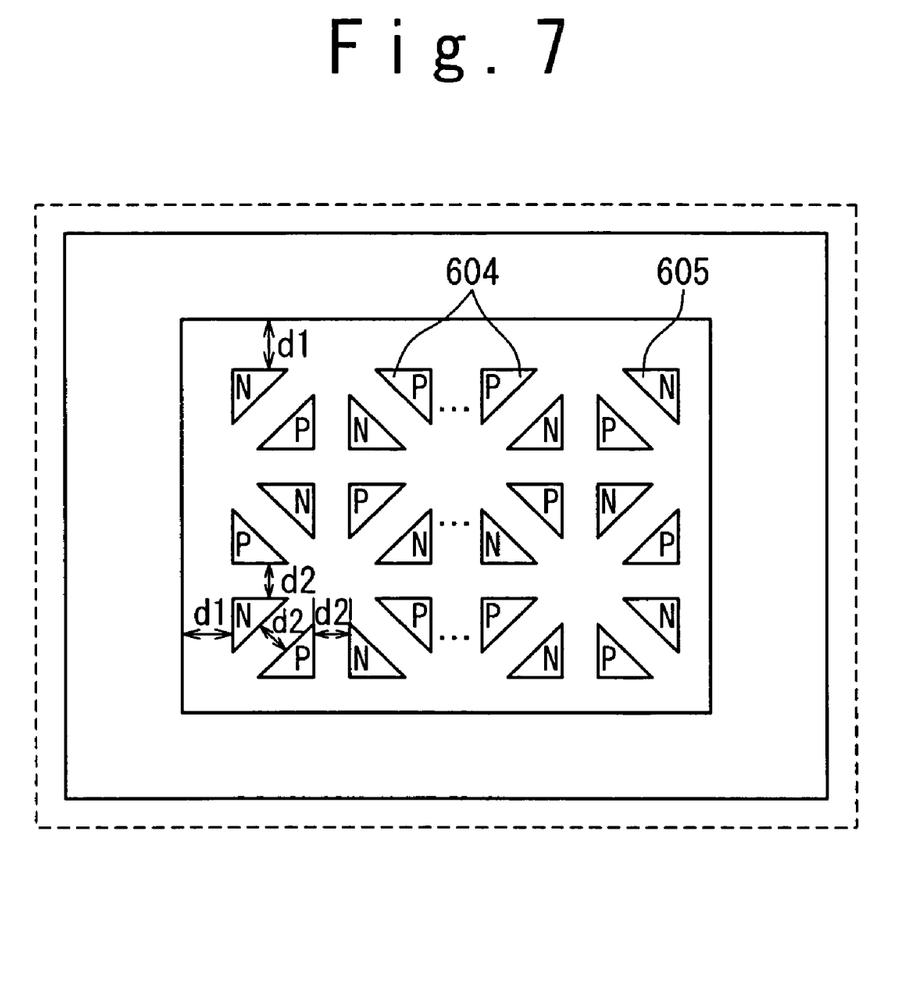
FIG. 7 is a plan view of the diode according to a third embodiment of the present invention.

Also, in the diode according to the third embodiment of the present invention, the shape of each of P$^+$-type diffusion region 604 and N$^+$-type diffusion region 605 is triangular, as shown in FIG. 7. In this case, the circumference length can be made larger, compared with a case that each diffusion region is rectangular. Therefore, the EDS breakdown voltage can be further improved. The definitions of the distances d1 and d2 are same as in the above embodiments.

Figure 8:
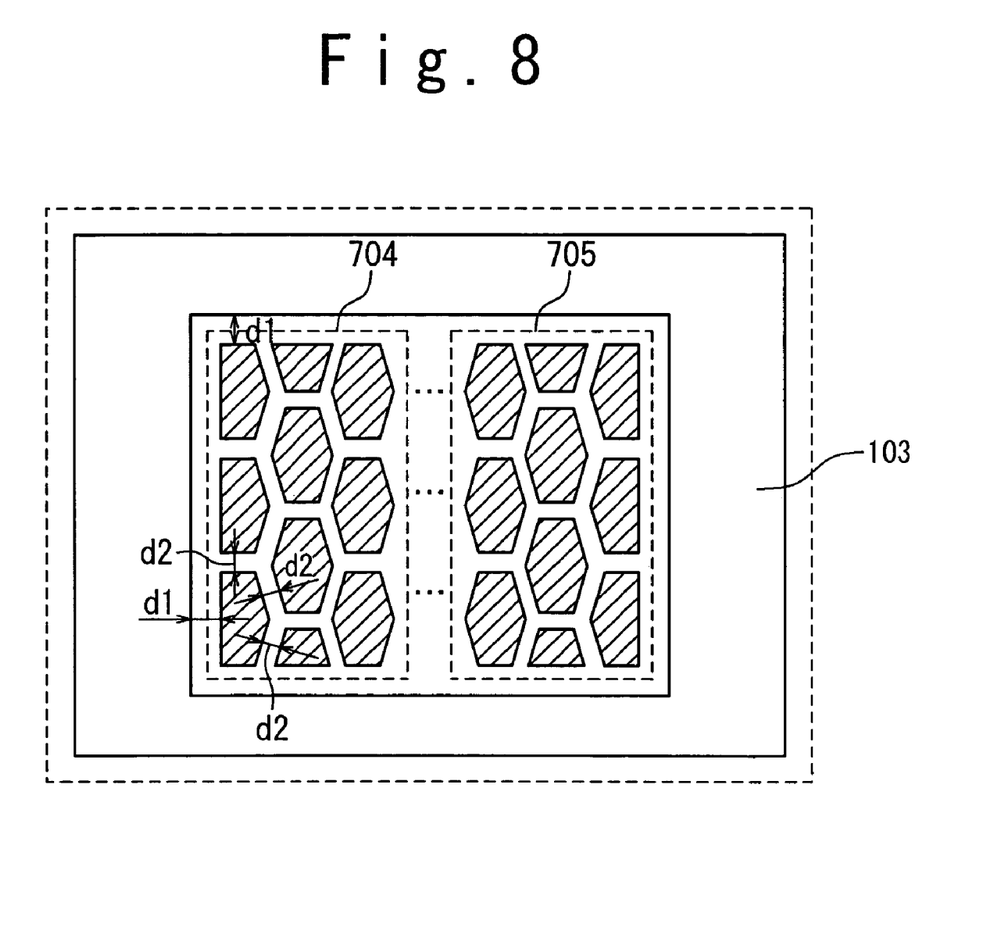
FIG. 8 is a plan view of the diode according to a fourth embodiment of the present invention.

Moreover, in the diode according to the fourth embodiment of the present invention, the shape of each of P$^+$-type diffusion region and N$^+$-type diffusion region is hexagonal, as shown in FIG. 8. In this case, the region surrounded by the P$^+$-type diffusion layer 103 in the ring can be effectively utilized. In this case, the diffusion region arranged in the outermost portion of the surrounded region is desired to have a part of the hexagonal shape, as shown in FIG. 8. Also, the P$^+$-type diffusion region and N$^+$-type diffusion region may be arranged alternately in the vertical direction or in the horizontal and vertical directions. In either case, the circumference length is same.

As described above, according to the semiconductor device of the present invention, the opposing area can be made large between the different conductive type diffusion regions so that the endurance can be improved even in case of the same area, compared with the conventional structure.

What is claimed is:

1. A semiconductor device comprising:
    a plurality of first diffusion regions of a first conductive type formed on a diffusion layer well of the first conductive type;
    a plurality of second diffusion regions of a second conductive type formed on said diffusion layer well of the first conductive type; and
    a third diffusion layer of the first conductive type formed on said diffusion layer well in a ring surrounding and separated by an annular insulation region from said plurality of first diffusion regions and said plurality of second diffusion regions.

2. The semiconductor device according to claim 1, wherein an impurity concentration of said third diffusion layer is higher than that of said diffusion layer well.

3. The semiconductor device according to claim 1, wherein said plurality of first diffusion regions are connected to a first common node as an anode and said plurality of second diffusion regions are connected to a second common node as a cathode, and
wherein said third diffusion layer is connected with said first common node.

4. A semiconductor device comprising:
a plurality of first diffusion regions of a first conductive type formed on a diffusion layer well of the first conductive type;
a plurality of second diffusion regions of a second conductive type formed on said diffusion layer well of the first conductive type, each of said plurality of second diffusion regions being separated from each of said plurality of first diffusion regions; and
an insulation region completely and separately surrounding each of said plurality of first diffusion regions and completely and separately surrounding each of said plurality of second diffusion regions.

5. The semiconductor device according to claim 4, wherein each of said first diffusion region and said second diffusion region is rectangular.

6. The semiconductor device according to claim 4, wherein each of said first diffusion region and said second diffusion region is circular.

7. The semiconductor device according to claim 4, wherein each of said first diffusion region and said second diffusion region is triangular.

8. The semiconductor device according to claim 4, wherein each of said first diffusion region and said second diffusion region is hexagonal.

9. A protection device comprising:
a semiconductor region of a first conductive type;
a first region of said first conductive type formed on said semiconductor region surrounding an area on said semiconductor region;
a plurality of second regions of said first conductive type formed in said area on said semiconductor region; and
a plurality of third regions of a second conductive type formed in said area on said semiconductor region,
wherein said first region is separated from each of said second and third regions by an insulation region and said second regions are separated from said third regions by said insulation region.

10. The protection device according to claim 9, further comprising:
an element separation region formed on said semiconductor region to surround said first region.

11. The protection device according to claim 9, further comprising:
an insulation region formed on said semiconductor region in said area except portions where said second and third regions are formed.

12. The protection device according to claim 9, wherein said first regions are arranged in a zigzag layout.

13. A protection device comprising:
a well of a first conductivity type in a semiconductor substrate;
an annular region in said well, said annular region being the first conductivity type with a higher impurity concentration than said well; and
plural first diffusion regions of the first conductivity type and plural second diffusion regions of a second conductivity type different than the first conductivity type within an area surrounded by said annular region, said plural first and second diffusion regions alternating in a matrix and being separated from each other and from said annular region by an insulator, wherein said plural first and second diffusion regions have a higher impurity concentration than said well.

14. The protection device of claim 13, wherein said plural first diffusion regions are connected to each other to be one electrode of the protection device and said plural second diffusion regions are connected to each other to be an opposite electrode of the protection device.

15. The protection device of claim 13, wherein each of said plural first and second diffusion regions is circular.

16. The protection device of claim 13, wherein each of said plural first and second diffusion regions is a polygon.

17. The semiconductor device of claim 4, further comprising a third diffusion layer of the first conductive type formed on said diffusion layer well in a ring surrounding said plurality of first diffusion regions and said plurality of second diffusion regions.

* * * * *